(12) United States Patent
Ge et al.

(10) Patent No.: US 10,336,069 B2
(45) Date of Patent: Jul. 2, 2019

(54) ELECTRICALLY-FUNCTIONAL OPTICAL TARGET

(71) Applicant: Hewlett-Packard Development Company, L.P., Houston, TX (US)

(72) Inventors: Ning Ge, Palo Alto, CA (US); Ser Chia Koh, Singapore (SG); Chaw Sing Ho, Singapore (SG); John Patrick Oliver, Leixlip (IE)

(73) Assignee: HEWLETT-PACKARD DEVELOPMENT COMPANY, L.P., Spring, TX (US)

( * ) Notice: Subject to any disclaimer, the term of this patent is extended or adjusted under 35 U.S.C. 154(b) by 0 days.

(21) Appl. No.: 15/748,831

(22) PCT Filed: Oct. 30, 2015

(86) PCT No.: PCT/US2015/058208
§ 371 (c)(1),
(2) Date: Jan. 30, 2018

(87) PCT Pub. No.: WO2017/074409
PCT Pub. Date: May 4, 2017

(65) Prior Publication Data
US 2018/0222188 A1 Aug. 9, 2018

(51) Int. Cl.
*B41J 2/045* (2006.01)
*B41J 2/14* (2006.01)
*H05K 1/16* (2006.01)

(52) U.S. Cl.
CPC ....... *B41J 2/14024* (2013.01); *B41J 2/04543* (2013.01); *H05K 1/167* (2013.01); *B41J 2202/11* (2013.01); *H05K 2203/013* (2013.01)

(58) Field of Classification Search
CPC B41J 2/04543; B41J 2/14024; B41J 2202/04; B41J 2202/11; H05K 1/16; H05K 1/167; H05K 2203/013
See application file for complete search history.

(56) References Cited

U.S. PATENT DOCUMENTS

| | | | |
|---|---|---|---|
| 5,049,898 A | 9/1991 | Arthur et al. | |
| 5,450,109 A | 9/1995 | Hock | |
| 5,466,484 A * | 11/1995 | Spraggins | G01K 7/22 257/529 |
| 5,951,893 A * | 9/1999 | Bitko | H01L 24/81 219/209 |
| 6,170,936 B1 | 1/2001 | Ahne et al. | |
| 6,502,915 B1 | 1/2003 | Feinn et al. | |
| 6,684,773 B2 | 2/2004 | Ravitz | |

(Continued)

OTHER PUBLICATIONS

Sou, A. et al., Programmable logic circuits for functional integrated smart plastic systems, Organic Electronics 15 (2014) 3111-3119.

*Primary Examiner* — Anh T Vo
(74) *Attorney, Agent, or Firm* — HP Inc. Patent Department

(57) ABSTRACT

In one example, a printhead having an electrically-functional optical target. The printhead includes a substrate. An optical target having an optically-distinguishable shape and formed from at least one polysilicon strip is deposited on the substrate. An electrical connection to at least one of the polysilicon strips connect the strip into a circuit that is deposited on the substrate.

21 Claims, 6 Drawing Sheets

(56) References Cited

U.S. PATENT DOCUMENTS

| | | | |
|---|---|---|---|
| 7,247,952 B2 * | 7/2007 | Dodd | H01L 23/544 |
| | | | 257/797 |
| 7,392,950 B2 | 7/2008 | Walmsley et al. | |
| 2001/0048968 A1 | 12/2001 | Royall et al. | |
| 2003/0202044 A1 | 10/2003 | Ward et al. | |
| 2005/0095439 A1 | 5/2005 | Dodd et al. | |
| 2006/0176350 A1 | 8/2006 | Howarth et al. | |

* cited by examiner

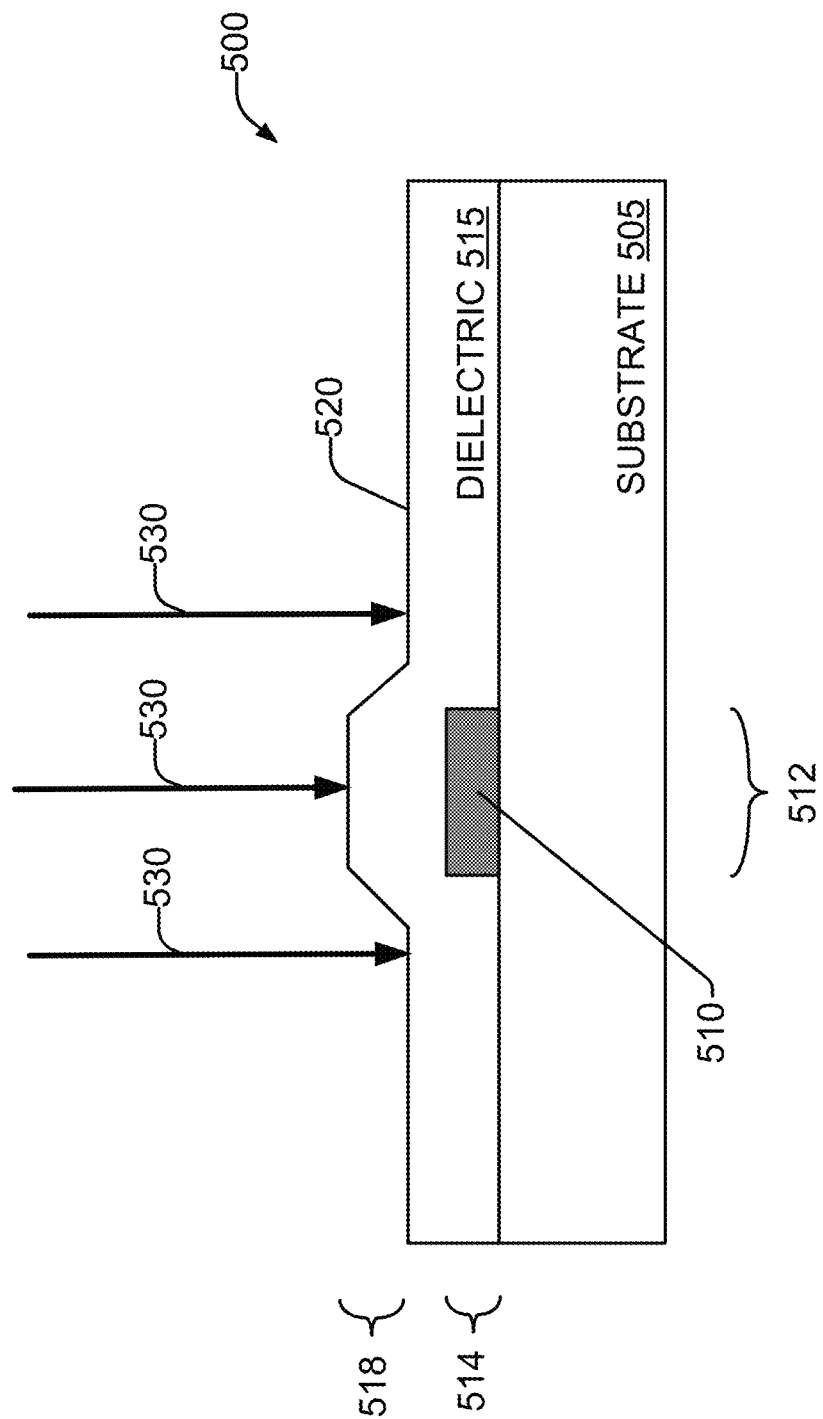

600

┌─────────────────────────────────────────────────────────┐
│ DEPOSIT ON A SUBSTRATE OF A PRINTHEAD DIE AT            │
│ LEAST ONE POLYSILICON STRIP FORMED IN AN                │
│ OPTICALLY DISTINGUISHABLE SHAPE USABLE TO LOCATE        │
│ THE OPTICAL TARGET ON THE DIE  610                      │
└─────────────────────────────────────────────────────────┘
                            │
┌─────────────────────────────────────────────────────────┐
│ CONNECT THE ENDS OF EACH POLYSILICON STRIP TO AN        │
│ ELECTRICAL CIRCUIT OF THE PRINTHEAD DIE, EACH           │
│ STRIP FORMING AN ACTIVE PULLDOWN RESISTOR OF THE        │
│ CIRCUIT  620                                            │
└─────────────────────────────────────────────────────────┘

FIG. 6 ically-functional optical target which is both an optical target and an electrical circuit component. The printhead has an optical target having an optically-distinguishable shape which is formed from at least one polysilicon strip deposited on a substrate. The printhead also has an electrical connection to at least one of the polysilicon strips in order to connect the strip into an electrical circuit that is also deposited on the substrate.

ELECTRICALLY-FUNCTIONAL OPTICAL TARGET

BACKGROUND

Many printheads used in printing systems, such as inkjet printheads for example, controllably eject drops of a liquid, such as an ink for example, from a tightly-packed arrangement of ejection elements onto a medium in order to form printed output. The printheads may be fabricated by depositing fluidic layers, such as layers for forming chambers of the ejection elements and/or otherwise routing the liquid, and thin-film electronic layers for controllably ejecting the drops, on a silicon die or wafer. During the fabrication process of many printheads, at least one optical target is formed on the printhead to facilitate alignment of at least some of these layers, or to provide a point of reference for other processing operations. It is desirable to minimize the size of a printhead, both to achieve high-quality printed output and to minimize printhead cost.

BRIEF DESCRIPTION OF THE DRAWINGS

FIG. 5 is a schematic cross-sectional representation of a portion of a printhead including a polysilicon strip of the electrically-functional optical target of FIG. 3 in accordance with an example of the present disclosure.

FIG. 6 is a flowchart according to an example of the present disclosure of a method of forming an electrically-functional optical target for a printhead.

DETAILED DESCRIPTION

Figure 1:
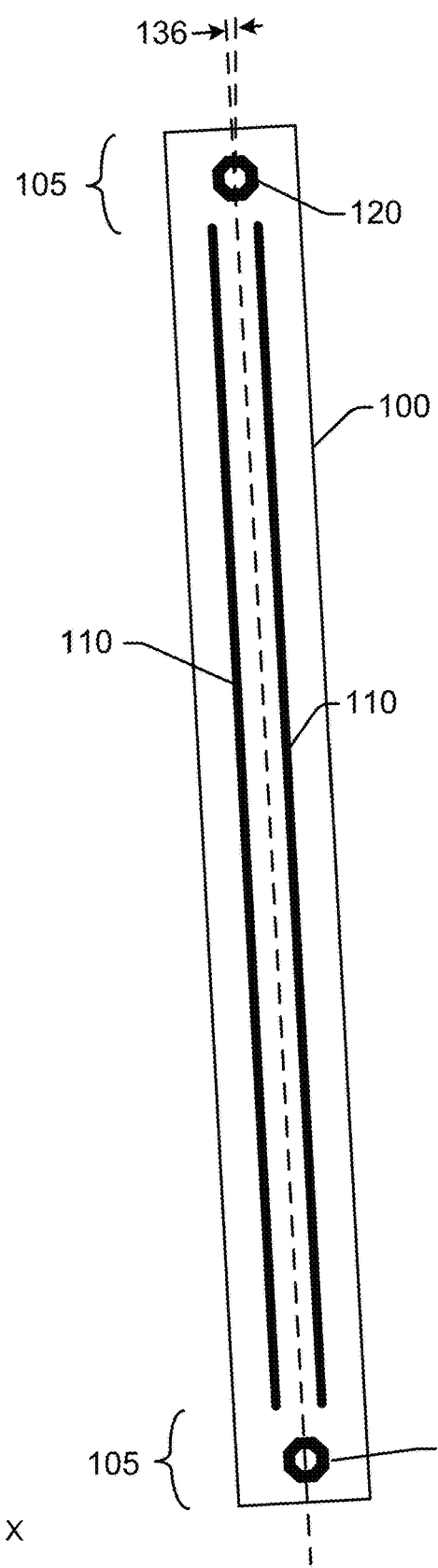
FIG. 1 is a schematic representation of a printhead having two electrically-functional optical targets in accordance with an example of the present disclosure.

An optical target may be fabricated using at least one strip of polycrystalline silicon ("polysilicon", or "poly") deposited in an optically-distinguishable shape on a substrate, such as silicon, of a printhead die. The polysilicon strips can produce a topographical difference at the die surface which can be optically detected by a vision system and/or a human observer using a microscope. An optical target can occupy a relatively large area of the printhead die.

Other polysilicon strips deposited on the substrate may form components of electrical circuits of the printhead. For example, polysilicon strips can have a sheet resistance which enables them to be used as electrically functional resistors, such as for example active pulldown resistors, or voltage divider resistors, in circuits that control the ejection of liquid drops from liquid ejection elements of the printhead. Some of the polysilicon resistor strips can also occupy a relatively large area of a printhead. The printhead die is sized to accommodate both the optical target and the resistors, in addition to other printhead components. Polysilicon strips may also be used to form other types of circuit elements as well.

Referring now to the drawings, there is illustrated an example of a printhead having an electrically-functional optical target which is both an optical target and an electrical circuit component. The printhead has an optical target having an optically-distinguishable shape which is formed from at least one polysilicon strip deposited on a substrate. The printhead also has an electrical connection to at least one of the polysilicon strips in order to connect the strip into an electrical circuit that is also deposited on the substrate.

Compared to an optical target that is not electrically functional and at least one separate resistor, the electrically-functional optical target can advantageously reduce the size of the printhead die. One or more electrical components that would otherwise occupy a surface area of the die separate from the optical target can now occupy some or all of the same surface area as the optical target. The cost savings that result from using less substrate material (e.g. silicon) can be quite significant due to the volume in which the printheads are manufactured.

As defined herein and in the appended claims, a "substrate" may be broadly understood to mean a substantially planar material, often silicon, onto which electrical and fluidic layers of a printhead are overlaid.

As defined herein and in the appended claims, a "printhead die" may be broadly understood to mean an unpackaged assembly of the substrate and at least one of the electrical and/or fluidic layers of a printhead.

As defined herein and in the appended claims, a "printhead" may be broadly understood to mean at least one printhead die with all its electrical and fluidic layers. A printhead may also include an enclosure for the at least one die and/or electrical connections and fluidic connections for connecting the printhead to a printing system. In some cases, the printhead may also include a fluid supply in the enclosure.

Considering now an example printhead, and with reference to FIG. 1, a printhead 100 includes an arrangement of liquid ejection elements. The printhead may have an elongated form. In one example, the printhead 100 has a length of 17 millimeters and a width of 3 millimeters. The printhead 100 has two substantially linear arrays 110 of liquid ejection elements. The ejection elements may alternatively be referred to as "nozzles", and the spacing of the ejection elements may be defined in "nozzles per inch" ("npi"), where in various examples the liquid ejection elements may be spaced at 300 npi, 600 npi, 1200 npi, or other spacings. In some examples, each array 110 ejects drops of a different fluid. In other examples, each array 110 ejects drops of a same fluid; the nozzles in one array 110 may be offset (in the direction of the array) from the nozzles of the other array 110 by, for example, ½ of the nozzle-to-nozzle spacing in an array, thus collectively forming a staggered nozzle arrangement that can achieve a printing resolution greater than the native nozzle resolution of a single array 110.

The example printhead 100 includes two electrically-functional optical targets 120 (although other printheads may have a single target, or more than two targets). The targets 120 are disposed in opposing end regions 105 of the printhead 100, although in other examples they may be disposed in other places on the printhead. In addition to the targets 120, a number of electrical components of the printhead 100 are disposed in the end regions 105.

The manufacturing process for the printhead 100 may include a number of steps and operations. A silicon substrate of a printhead die is provided. Various thin-film electrical layers are sequentially deposited on the substrate to form electrical control signal circuits and the liquid ejection elements. Various fluidic layers for routing the liquid and defining chambers for each liquid ejection element are deposited over the electrical layers. A cover layer which covers the chambers, and provides a nozzle for each liquid ejection element through which drops of the liquid are ejected and directed, is deposited or attached. The printhead 100 functions properly when the various electrical and fluidic layers are properly aligned with each other. The targets 120 may be used in the manufacturing process for aligning various ones of the layers and/or for other alignment operations.

With regard to alignment, the location of the two optical targets 120 with reference to the X axis 132 and Y axis 134 of a coordinate system collectively define an x-position, a y-position, and a skew 136 of the printhead die. With this information, the printhead die and/or the manufacturing equipment can be aligned relative to each other.

After the printhead die is completely fabricated, and in some cases tested, the die may be packaged into an enclosure for the printhead. In some examples, multiple die may be arranged in a single enclosure. In some cases, multiple die may be arranged substantially end-to-end to form a printbar. In some examples, the enclosure provides external electrical and/or fluidic connections through which a printer or printing system interfaces to the printhead or printbar, and routes the electrical signals and fluids to the printhead die. In some examples, a fluid supply may be included within the enclosure itself.

Figure 2:
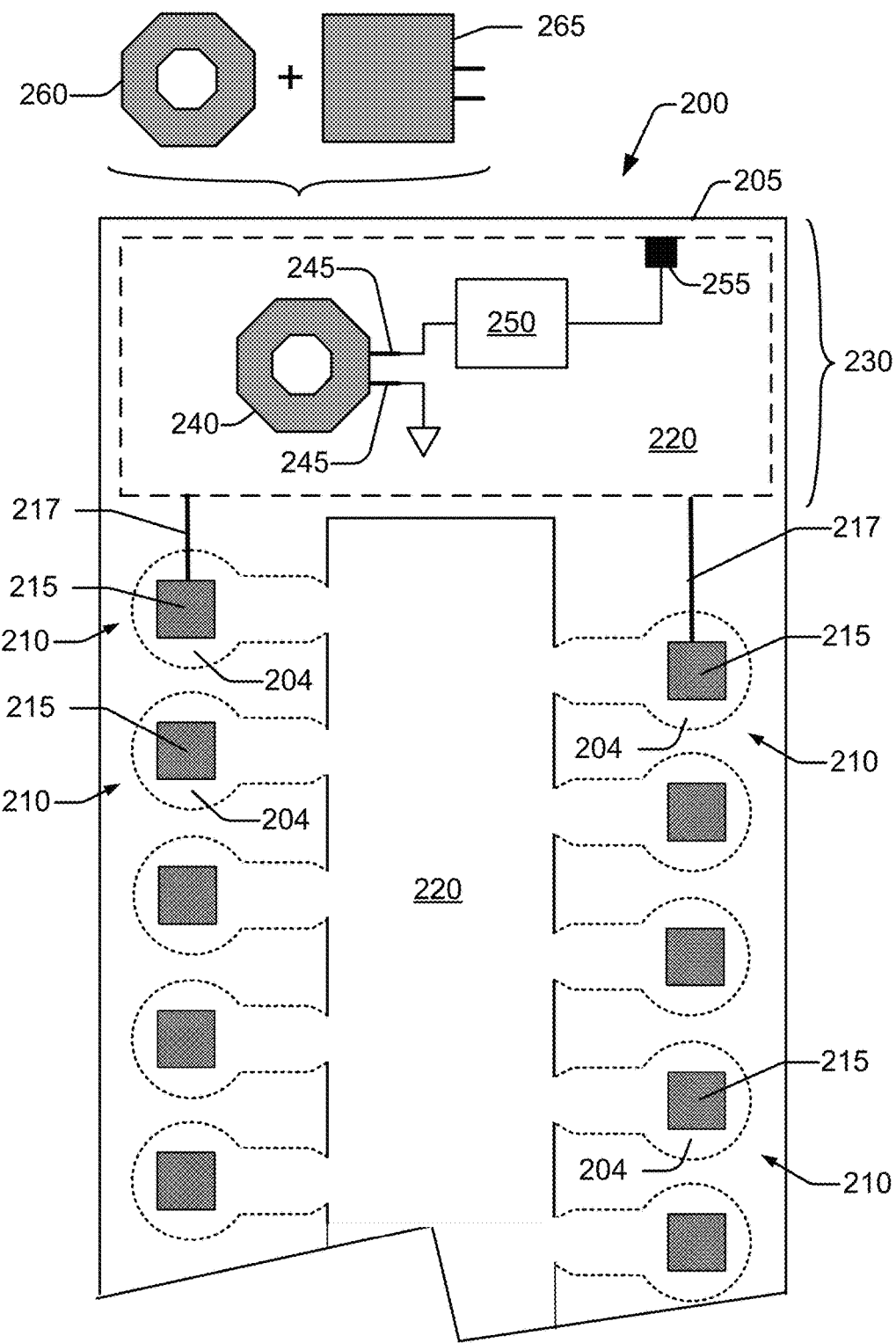
FIG. 2 is a schematic representation of an end portion of a printhead die usable in the printhead of FIG. 1 in accordance with an example of the present disclosure.

Considering now an example printhead die, and with reference to FIG. 2, one end of a printhead die 200 is illustrated schematically. The view of FIG. 2 looks down onto the die 200 and through the fluidic and electrical layers towards the substrate 205. In some examples, the printhead die 200 may be the die of the printhead 100 (FIG. 1).

The die 200 includes plural liquid ejection elements 210 (also known as "drop generators" or "drop ejectors") formed on the substrate 205. In some examples, a liquid ejection element 210 is a thermal inkjet ejection element. In other examples, a liquid ejection element 210 is a piezoelectric ejection element, or an ejection element of another technology.

In some examples, a liquid feed slot 220 is formed through the substrate 205 to provide the liquid to the ejection elements 210. For clarity of illustration, the fluidic layers are assumed to be transparent in FIG. 2 in order to show certain features of the underlying substrate 205 and electrical layers. Therefore, the fluidic chambers 204 of the ejection elements 210 are illustrated in FIG. 2 using dashed lines.

Electronic circuits, including various circuit elements and conductive lines, are formed on the substrate 205 via thin-film deposition of various layers of conductive and non-conductive materials. Where the liquid ejection elements 210 are thermal inkjet ejection elements, each element 210 includes a firing resistor 215 which controllably superheats liquid adjacent the resistor 215 to cause drop ejection from that element 210. Each firing resistor 215 is electrically coupled via at least one corresponding conductor 217 to control electronics 220 which generate the control signal for that individual ejection element 210. (For clarity of illustration, FIG. 2 illustrates the conductors 217 for the uppermost two ejection elements 210 of the die 200, but not for any of the other ejection elements 210.) In one example, the control electronics 220 are located in an end region 230 of the die 200, although in other die they may be located in other locations on the die.

An electrically-functional optical target 240 is disposed within an end region 230 of the substrate 205. In terms of its optical functionality, the target 240 has an optically-distinguishable shape. In terms of its electrical functionality, the target 240 is a circuit element of the control electronics 220.

The electrically-functional optical target 240 is formed of at least one polysilicon strip deposited on the substrate 205. In one example, each polysilicon strip of the optical target 240 forms a different resistor. The two ends 245 of a polysilicon strip are connected into a circuit 250 of the control electronics 220. In one example, the resistor functions as an active pulldown resistor for a signal that is received at a bond pad 255 of the die 205. In some examples, the polysilicon strip has a resistance in the range of 5,000 to 50,000 ohms.

As is discussed subsequently with reference to FIG. 3, the electrically-functional optical target 240 advantageously combines the functions of a non-electrically functional optical target 260 formed from polysilicon deposited at one location in the end region 230, and an electrical resistor 265 which is formed from polysilicon deposited at another, different location in the end region 230. By combining both of these optical and electrical functions into a single element 240 at one location, the end region 230 of the substrate 205 can be reduced in size because the separate resistor 265 is eliminated. This, in turn, reduces both the size and the material cost of the substrate 205.

Figure 3:
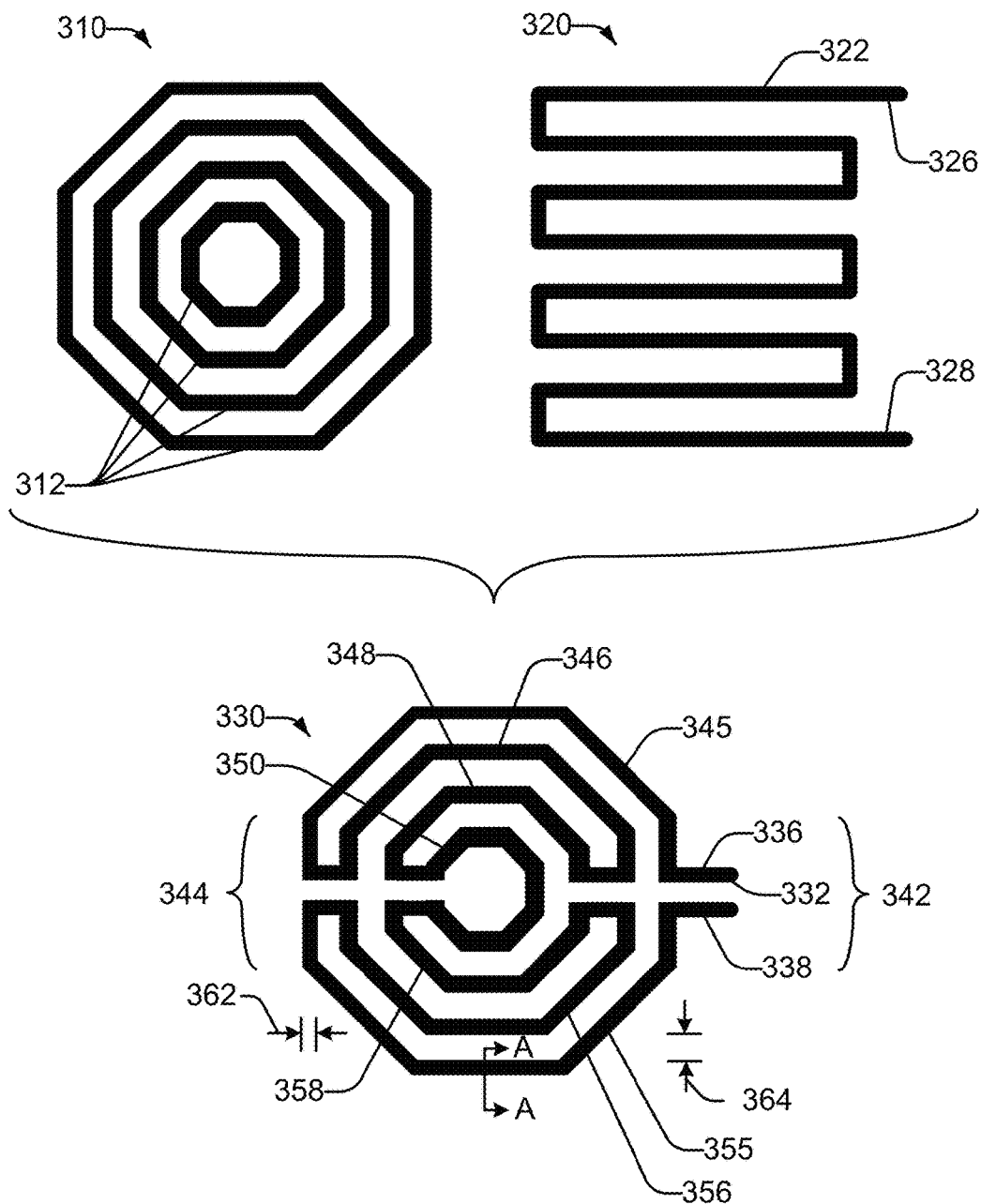
FIG. 3 is a schematic representation of an electrically-functional optical target, usable with the printhead of FIG. 1 and/or FIG. 2, that combines an optical target with an electrically functional resistor in accordance with an example of the present disclosure.

Considering now in greater detail an electrically-functional optical target, and with reference to FIG. 3, an electrically-functional optical target 330 may be, for example, the optical target 120 (FIG. 1), 240 (FIG. 2). The electrically-functional optical target 330 performs both the optical target function of a non-electrically-functional optical target 310, and the electrical function of a electrical resistor 320 separate from the target 310. A single target 330 replaces both the target 310 and the resistor 320.

Both the non-electrically-functional optical target 310 and the electrically-functional optical target 330 have a shape which is optically-distinguishable from other features of the die. In some examples, they can be distinguished by an automated vision system. In other examples, they can be distinguished by a human observer assisted by magnification. The targets 310, 330 have an octagonal shape, and thus have eight sides (or "faces"). In other examples, the shape of the optical target is that of a non-rectangular polygon. A rectangular (including a square) polygon is excluded, since other features of the die may also have a rectangular shape, and thus the optical target 310, 330 might not be optically distinguishable from such features. The more sides the polygon has, the smaller the surface area of the die occupied by the target 310, 330. However, the more sides the polygon has, the more it approaches a circular appearance, which might not be optically-distinguishable from other features of the die. Thus, for some examples, an octagonal polygon provides an optimal balance between size and distinguishability.

The non-electrically-functional optical target 310 is formed by a set of concentric polygonal poly strips 312, with adjacent strips 312 spaced apart from each other by a gap. Each poly strip 312 is closed, having no ends. Other non-electrically-functional optical targets may be formed in different ways; for example, a single poly strip could begin at an inner radius, form a polygon, and then step outward every 360 degrees, or at other angles, to begin a larger polygon, repeating this until an outer radius is reached. In one example, the optical target 310 has a diameter at its widest point of about 275 microns.

The resistor 320 has a poly strip 322 with a particular sheet resistance (measured in ohms per square). The poly strip 322 is formed in a serpentine pattern of sufficient length to achieve the desired resistance between the ends 326, 328 of the poly strip 322. In one example, the resistor 320 occupies an area on the die of about 264 microns by 336 microns.

The electrically-functional optical target 330 has the same overall shape, or a similar overall shape, as the non-electrically-functional optical target 310, and also functions electrically as a resistor. The electrically-functional optical target 330 is formed from a single poly strip 332. The single poly strip 302 is not closed; rather it has two ends 336, 338. The first and second ends 336, 338 are on a first face 342 of the polygon; as a result, there is a discontinuity or opening in the polygon at the first face 342.

The polysilicon strip 332 has a serpentine pattern that forms concentric polygons of the same type. Beginning at the first end 336, the poly strip 332 forms the top half 345 of an outermost polygon. At a second face 344 of the octagon, the top half 345 is completed. The poly strip 332 turns inward, and retraces its path in the opposite direction in a serpentine manner to form the top half 346 of a first interior octagon. As a result of the serpentine pattern, there is also a discontinuity in the polygon at the second face 344. At the first face 342, the top half 346 of the first interior polygon is complete. The poly strip again turns inward and retraces its path in the original direction in a serpentine manner to form the top half 348 of a second interior polygon. At the second face 344 of the second interior polygon, the top half 348 is completed. The poly strip 332 turns inward, and retraces its path in the opposite direction in a serpentine manner to form both halves of an innermost octagon 350. Then, from the second face 344, the bottom half 358 of the second interior polygon, the bottom half 356 of the first interior polygon, and the bottom half 355 of the outermost polygon respectively are constructed in an manner analogous to the top halves 348, 346, 345. When the bottom half 355 of the outermost polygon is finished at the first face 342, the poly strip 332 terminates at the second end 338. Each concentric polygon thus has a discontinuity at its first 342 and second 344 faces. Because of the discontinuities, the concentric polygons are not "closed" polygons, but rather "open" polygons. Regardless of whether the concentric polygons are closed or open, however, the optical target 330 is optically distinguishable as a polygon by a vision system and/or a human observer.

In other examples of an electrically-functional optical target, the ends 336, 338 may be on different faces of the polygon rather than on the same face of the polygon. Other examples of an electrically-functional optical target may have more or fewer interior polygons than the target 330.

Because the electrically-functional optical target 330 also functions as an electrical circuit element, such as for example a resistor, the size of the target, the width of the poly strip, the length of the poly strip, and/or the spacing between poly strips may vary. In one example, the diameter of the electrically-functional optical target 330 at its widest point is in the range of 200 to 500 microns; the width 362 of the poly strip 332 is in the range of 2 to 5 microns; and the spacing 364 between concentric polygons is in the range of 2 to 4 microns. An electrically-functional optical target with such characteristics is both optically distinguishable from other features on the die, and can provide a resistor having a resistance of 5,000 to 50,000 ohms. Because the optical target functionality and the resistor functionality are combined in the electrically-functional optical target 330, a separate resistor such as the resistor 320 is eliminated, reducing both the size and the material cost of the printhead die.

Considering the electrical characteristics of the poly strip 332 in greater detail, polysilicon is commonly used in thin-film semiconductor fabrication. While un-doped polysilicon has high resistivity, it can be doped to provide a desired lower resistivity. In one example, phosphoryl chloride (POCl3) is used as a phosphorous source for N-type doping of the polysilicon. Appropriately-doped polysilicon can be used to form various electrical components of the printhead die, including gates and routing traces as well as resistors. The doped polysilicon can handle relatively large amounts of current and withstand high temperatures.

The poly strip 332 is formed from appropriately-doped polysilicon. The poly strip 332 has a sheet resistance (measured in ohms per square). For a particular doping of the polysilicon, the width 362, 512 (FIG. 5) and the thickness 514 (FIG. 5) of the poly strip 332 define its sheet resistance for a "square", or a length of the poly strip 332 which is the same as the width of the poly strip 332. In some examples, the sheet resistance of the poly strip 332 is in the range of 25 to 30 ohms per square. The total length of the poly strip 332 (and thus the number of squares in the strip 332) determine the resistance of the poly strip 332 between its two ends 336, 338. During the thin-film layer deposition, electrical connections are made to the two ends 336, 338 in order to connect the electrically-functional optical target 330 into the appropriate circuit. This is the same as or similar to the electrical connection of the optical target 240 into the circuit 250 (FIG. 2).

Figures 4A, 4B, 4C:
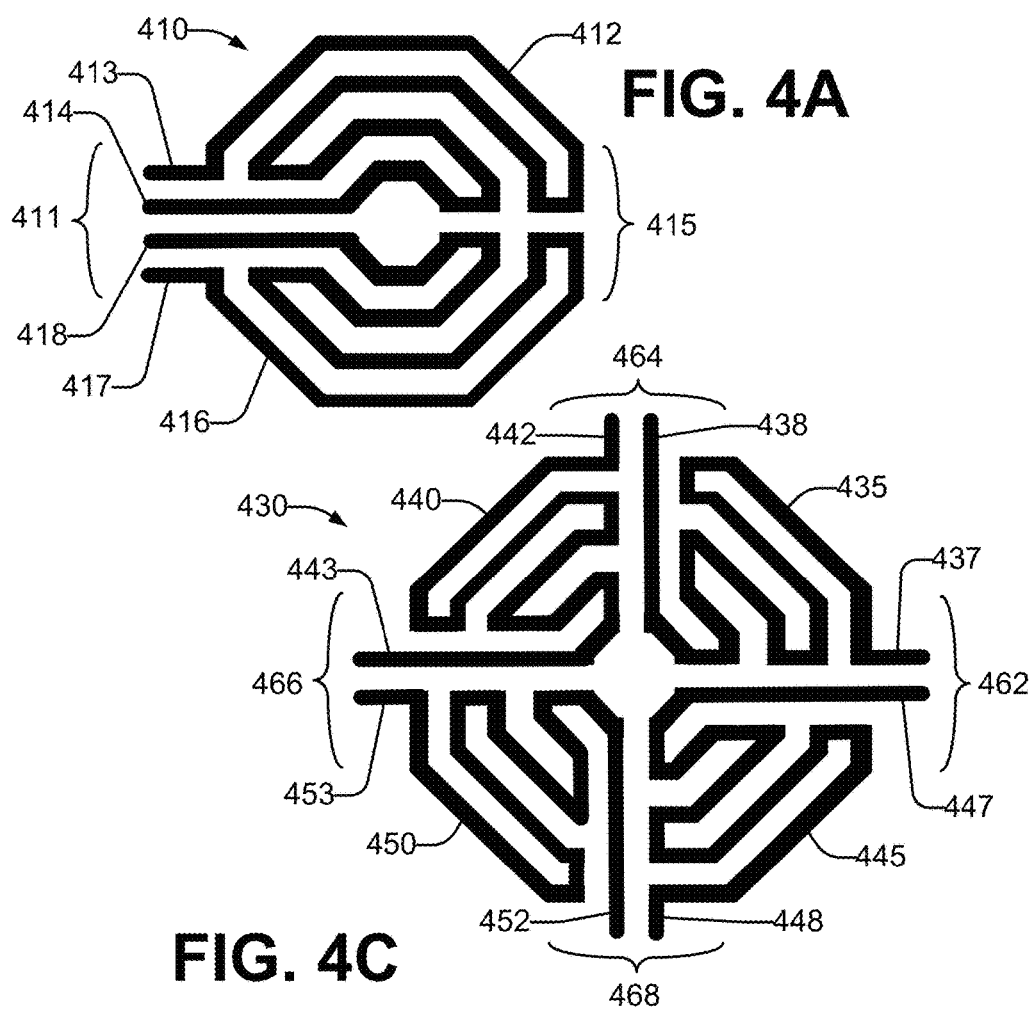
FIGS. 4A through 4C are schematic representation of additional electrically-functional optical targets, usable with the printhead of FIG. 1 and/or FIG. 2, that combine an optical target with plural resistors in accordance with an example of the present disclosure.

Considering now additional electrically-functional optical targets, and with reference to FIGS. 4A through 4C, a single electrically-functional optical target may include plural polysilicon strips with serpentine patterns that collectively form the optically-distinguishable shape. Each of the poly strips has a serpentine pattern which forms a portion of concentric polygons of a same type. Each polysilicon strip is a different resistor. As such, the electrically-functional optical target can reduce the surface area of the die by as much as the amount of space that would be occupied by the multiple different resistors it eliminates. In addition, by eliminating at least one separate resistor, the electrically-functional optical target can simplify die layout planning and/or the die design more efficient.

One example electrically-functional optical target 410 of FIG. 4A has two poly strips 412, 416. Each poly strip 412, 416 is a different resistor. The first poly strip 412 has a first resistance between leads 413, 414. The second poly strip 416 has a second resistance between leads 417, 417. The first and second resistances may be the same or different. The polygonal shape of the optical target 410 is an octagon. The first poly strip 412 forms the upper half of the octagon, and the second poly strip 416 forms the lower half of the octagon. All four leads 413, 414, 417, 418 are on a same face 411 of the octagon. Two faces 411, 415 of the octagon have a discontinuity due to the leads and/or the serpentine pattern.

Another example electrically-functional optical target 420 of FIG. 4B has two poly strips 422, 426. Each poly strip 422, 426 is a different resistor. The first poly strip 422 has a first resistance between leads 423, 424. The second poly strip 426 has a second resistance between leads 427, 427. The first and second resistances may be the same or different. The polygonal shape of the optical target 420 is an octagon. The first poly strip 422 forms the upper half of the octagon, and the second poly strip 426 forms the lower half of the octagon. Two faces 421, 425 of the octagon have a discontinuity due to the leads and/or the serpentine pattern. For poly strip 422, lead 423 is on face 421, while lead 424 is on face 425. For poly strip 426, lead 427 is on face 421, while lead 427 is on face 425.

Yet another example electrically-functional optical target 430 of FIG. 4C has four poly strips 435, 440, 445, 450. Each poly strip 435, 440, 445, 450 is a different resistor. The first poly strip 435 has a first resistance between leads 437, 438. The second poly strip 440 has a second resistance between leads 442, 443. The third poly strip 445 has a third resistance between leads 447, 448. The fourth poly strip 450 has a fourth resistance between leads 452, 453. The four resistances may be the same, or at least some may be different from others. The polygonal shape of the optical target 430 is an octagon. Each poly strip 435, 440, 445, 450 forms a different quadrant of the octagon. Four faces 462, 464, 466, 468 of the octagon have a discontinuity due to the leads and/or the serpentine pattern.

Despite the various discontinuities in various faces of the electrically-functional optical target 410, 420, 430, and the serpentine turns in the poly strips which form the concentric polygons, the optical targets 410, 420, 430 are optically distinguishable as polygons by a vision system and/or a human observer. Other multiple-resistor electrically-functional optical target configurations may be constructed using the general principles described and illustrated with reference to FIGS. 3 and 4A through 4C.

Considering now the optical characteristics of an electrically-functional optical target, and with reference to FIG. 5, a cross-section of a portion of a printhead die 500 includes a poly strip of the optical target. The cross-section corresponds to the view along line A-A of FIG. 3, and as such illustrates a portion of a poly strip 510 of the optical target.

The die 500 has a substrate 505. Thin-film electrically conductive and insulative layers are deposited on the substrate 505 using semiconductor fabrication methods. Different layers may be deposited for different fabrication methods. In the cross-sectional region illustrated, a conductive polysilicon strip 510 is deposited over the substrate 505. The poly strip 510 has a width 512 and a thickness 514 which, as described heretofore with reference to FIG. 3, determine the sheet resistance of the poly strip 510. In examples, the width 512 is in the range of 2 to 5 microns, and the thickness 514 is in the range of 2000 to 8000 angstroms.

At least one dielectric layer 515 is deposited over the polysilicon strip 510. The material used for a dielectric layer may be PSG, TEOS, or another insulative material.

The top surface 520 of the die 500 is topographically contoured in the region of the underlying poly strip 510. A height difference 518 in the contour of the top surface 520 of the die 500 is perceivable by a vision system and/or human observer, as a difference in illumination and/or contrast, when the top surface 520 is viewed in the direction 530. The height difference 518 over the poly strips that form the electrically-functional optical target enables the polygonal shape of the target to be detected and distinguished from other features of the die 500.

Fluidic layers are not illustrated in FIG. 5. In some examples, the fluidic layers are not deposited over the surface area of the substrate occupied by the optical target. In other examples, the fluidic layers are deposited over the optical target but at a later stage of fabrication than illustrated in FIG. 5.

The illustrated cross-section A-A does not correspond to an end of the poly strip 510 where an electrical connections to the strip 510 is made. At the ends, the electrical connections may be made using semiconductor fabrication methods. In one example, a connection may be made from a thin-film metal layer to an end of the poly strip 510, in some cases using a conductive via between layers. The electrical connections to the poly strip 510 may be made in other ways as well.

Considering now a method of forming an electrically-functional optical target for a printhead, and with reference to FIG. 6, a method 600 begins at 610 by depositing on a substrate of a printhead die at least one polysilicon strip. The at least one strip is formed in an optically distinguishable shape usable to locate the optical target on the die. At 620, the ends of each polysilicon strip are connected to an electrical circuit of the printhead die. In some examples, each strip forms an active pulldown resistor of the circuit Terms of orientation and relative position (such as "top," "bottom," "side," and the like) are not intended to indicate a particular orientation of any element or assembly, and are used for convenience of illustration and description.

In some examples, at least one block or step discussed herein is automated. In other words, apparatus, systems, and methods occur automatically. As defined herein and in the appended claims, the terms "automated" or "automatically" (and like variations thereof) shall be broadly understood to mean controlled operation of an apparatus, system, and/or process using computers and/or mechanical/electrical devices without the necessity of human intervention, observation, effort and/or decision.

From the foregoing it will be appreciated that the printhead, printhead die, and method provided by the present disclosure represent a significant advance in the art. Although several specific examples have been described and illustrated, the disclosure is not limited to the specific methods, forms, or arrangements of parts so described and illustrated. This description should be understood to include all novel and non-obvious combinations of elements described herein, and claims may be presented in this or a later application to any novel and non-obvious combination of these elements. The foregoing examples are illustrative, and different features or elements may be included in various combinations that may be claimed in this or a later application. Unless otherwise specified, operations of a method claim need not be performed in the order specified. Similarly, blocks in diagrams or numbers (such as (1), (2), etc.) should not be construed as operations that proceed in a particular order. Additional blocks/operations may be added, some blocks/operations removed, or the order of the blocks/operations altered and still be within the scope of the disclosed examples. Further, methods or operations discussed within different figures can be added to or exchanged with methods or operations in other figures. Further yet, specific numerical data values (such as specific quantities, numbers, categories, etc.) or other specific information should be interpreted as illustrative for discussing the examples. Such specific information is not provided to limit examples. The disclosure is not limited to the above-described implementations, but instead is defined by the appended claims in light of their full scope of equivalents. Where the claims recite "a" or "a first" element of the equivalent thereof, such claims should be understood to include incorporation of at least one such element, neither requiring nor excluding two or more such elements. Where the claims recite "having", the term should be understood to mean "comprising".

What is claimed is:

1. A printhead having an electrically-functional optical target, comprising:
   a substrate;
   an optical target having an optically-distinguishable shape and formed from at least one polysilicon strip deposited on the substrate, wherein the at least one polysilicon strip has a serpentine pattern forming concentric polygons; and
   an electrical connection to the at least one polysilicon strip to connect the at least one polysilicon strip into a circuit deposited on the substrate.

2. The printhead of claim 1, wherein the electrical connection comprises an electrical connection to each end of the at least one polysilicon strip, and the at least one polysilicon strip is a resistor having a resistance in a range of 5,000 to 50,000 ohms.

3. The printhead of claim 1, wherein the at least one polysilicon strip comprises plural polysilicon strips, and wherein the electrical connection comprises an electrical connection to each end of each of the plural polysilicon strips, and each polysilicon strip is a different resistor having a resistance in a range of 5,000 to 50,000 ohms.

4. The printhead of claim 1, wherein the at least one polysilicon strip comprises plural polysilicon strips collectively forming the optically-distinguishable shape.

5. The printhead of claim 1, wherein the concentric polygons are concentric non-rectangular polygons.

6. The printhead of claim 1, wherein the at least one polysilicon strip comprises plural polysilicon strips, and wherein each of the plural polysilicon strips has a serpentine pattern forming the concentric polygons of a same type.

7. The printhead of claim 1, wherein the at least one polysilicon strip produces an optically-detectable topographical difference at a surface of the substrate.

8. The printhead of claim 1, wherein the at least one polysilicon strip has a width in a range of 2 to 5 microns, a thickness in a range of 2000 to 8000 angstroms, and a sheet resistance in a range of 25 to 30 ohms per square.

9. The printhead of claim 1, wherein the optical target has a diameter in a range of 200 to 500 microns.

10. The printhead of claim 1, wherein a polygon of the concentric polygons has a discontinuity at plural faces of the polygon.

11. The printhead of claim 1, wherein each polygon of the concentric polygons is not closed.

12. A printhead die, comprising:
    an elongated substrate;
    electrically-functional first and second optical targets disposed on the substrate at opposite ends, each respective target of the first and second optical targets comprising:
       at least one polysilicon strip formed in an optically-distinguishable shape, wherein the at least one polysilicon strip has a serpentine pattern forming concentric polygons, and
       an electrical connection to each end of the at least one polysilicon strip to connect the at least one polysilicon strip as a resistor of a circuit deposited on the substrate.

13. The printhead die of claim 12, wherein locations of the first and second optical targets define an x-position, y-position, and skew of the printhead die with reference to a coordinate system.

14. The printhead die of claim 12, wherein the resistor is an active pulldown resistor having a resistance in a range of 5,000 to 50,000 ohms.

15. The printhead die of claim 12, wherein each polygon of the concentric polygons is an open polygon.

16. The printhead die of claim 15, wherein each respective polygon of the concentric polygons has a discontinuity at plural faces of the respective polygon.

17. The printhead die of claim 12, wherein the at least one polysilicon strip comprises plural polysilicon strips that form the concentric polygons.

18. The printhead die of claim 12, wherein the concentric polygons are concentric non-rectangular polygons.

19. A method of forming an electrically-functional optical target for a printhead, comprising:
    depositing on a substrate of a printhead die at least one polysilicon strip, the at least one polysilicon strip formed in an optically distinguishable shape usable to locate the optical target on the printhead die, wherein the optically distinguishable shape is a polygon, wherein at least two faces of the polygon have a discontinuity; and
    connecting ends of the at least one polysilicon strip to an electrical circuit of the printhead die, the at least one polysilicon strip forming an active pulldown resistor of the electrical circuit.

20. The method of claim 19, wherein the at least one polysilicon strip has a serpentine pattern forming at least a portion of concentric polygons of a same type.

21. The method of claim 19, wherein the polygon is a non-rectangular polygon.

* * * * *